United States Patent
Chang et al.

(10) Patent No.: US 8,101,340 B2
(45) Date of Patent: Jan. 24, 2012

(54) METHOD OF INHIBITING PHOTORESIST PATTERN COLLAPSE

(75) Inventors: Ching-Yu Chang, Yilang County (TW); Heng-Jen Lee, Baoshan Township, Hsinchu County (TW); Chin-Hsiang Lin, Hsin-chu (TW); Hua-Tai Lin, HsinChu (TW); Kuei Shun Chen, Hsin-Chu (TW); Bang-Chein Ho, Jhudong Township, Hsinchu County (TW); Li-Kong Turn, Hsin-Chu (TW); Hung-Jui Kuo, Hsinchu (TW); Ko-Bin Kao, Shengang Township, Taichung County (TW); Tsung-Chih Chien, Caotun Township, Nantou County (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 629 days.

(21) Appl. No.: 11/746,202

(22) Filed: May 9, 2007

(65) Prior Publication Data
US 2007/0264594 A1    Nov. 15, 2007

Related U.S. Application Data

(60) Provisional application No. 60/799,303, filed on May 10, 2006.

(51) Int. Cl.
G03F 7/00    (2006.01)

(52) U.S. Cl. .................. 430/322; 430/273.1; 430/276.1; 430/311; 430/330

(58) Field of Classification Search ............... 430/273.1, 430/276.1, 311, 322, 330; 134/902
See application file for complete search history.

(56) References Cited

U.S. PATENT DOCUMENTS

| | | | |
|---|---|---|---|
| 2003/0157801 A1* | 8/2003 | Kozawa et al. | 438/689 |
| 2004/0137377 A1* | 7/2004 | Shinbori et al. | 430/325 |
| 2006/0057507 A1* | 3/2006 | Chang et al. | 430/327 |
| 2006/0118956 A1* | 6/2006 | Ho et al. | 257/758 |
| 2006/0127803 A1* | 6/2006 | Jung et al. | 430/270.1 |
| 2006/0292500 A1* | 12/2006 | Roberts et al. | 430/322 |

* cited by examiner

Primary Examiner — Thorl Chea
(74) Attorney, Agent, or Firm — Tung & Associates

(57) ABSTRACT

A method of inhibiting photoresist pattern collapse which includes the steps of providing a substrate; providing a photoresist layer on the substrate; exposing and developing the photoresist layer; applying a top anti-reflective coating layer to the photoresist layer; rinsing the photoresist layer; and drying the photoresist layer.

20 Claims, 3 Drawing Sheets

METHOD OF INHIBITING PHOTORESIST PATTERN COLLAPSE

This application is an application which claims the benefit of U.S. Provisional. Application No. 60/799,303 filed May 10, 2006.

FIELD OF THE INVENTION

The present invention relates to development of photoresist patterns in the fabrication of semiconductors. More particularly, the present invention relates to a method of inhibiting collapse of photoresist patterns and defects by applying a water-soluble polymer coating to a developed photoresist pattern before, during or after subjecting the photoresist to post-development rinsing.

BACKGROUND OF INVENTION

In the semiconductor fabrication process, circuit structures are commonly formed on a substrate using a photolithography process. Photolithography involves coating a photoresist layer on a substrate, forming a device pattern in the photoresist and developing the photoresist. The photolithography process is followed by forming a metal conductive layer on the substrate according to the circuit pattern defined by the developed and patterned photoresist.

In a conventional photolithography process, the photoresist is coated on the surface of the substrate. A baking process is then used to evaporate solvent in the photoresist and densify the resist. This is followed by an exposure process in which light is transmitted through a patterned mask onto the photoresist. The exposed photoresist is subjected to cleavage, followed by photoresist development. At the development step, the photoresist is exposed to a liquid developer solution such as TMAH. The developer solution removes the unexposed polymer portions of the photoresist from the substrate. The developed photoresist is then subjected to water rinsing typically using DI water. Finally, a post-rinse spin drying step is carried out. An additional baking step may be used to evaporate any additional moisture from the photoresist surface.

A photoresist structure 10 is shown in FIGS. 1A and 1B and includes a BARC (bottom anti-reflective coating) layer 14 provided on a substrate 12. Adjacent photoresist lines 16 of a developed photoresist layer are provided on the BARC layer 14. A space 18 is defined between adjacent photoresist lines 16. The photoresist lines 16 define the boundaries of the circuit pattern which is to be subsequently formed on the substrate 12 after photolithography.

After development of the photoresist, open hydrophobic areas 20 frequently exist on the surface of the BARC layer 14 where exposed polymer portions of the positive photoresist were removed from the substrate. The lateral surfaces of the developed photoresist lines 16 are hydrophilic. The hydrophilic surfaces of the lateral surface of the lines 16 and the hydrophobic surface of the BARC layer 14 induce watermarks, which is near the line pattern, on the surface of the BARC layer 14 after the developed photoresist is rinsed and then subjected to the spin-drying step. Furthermore, some of the water from the post-development rinsing step is trapped in the space 18 between the photoresist lines 16. During the spin-drying and post-development baking steps, the trapped water shrinks and induces pattern collapse. The resulting capillary action between the photoresist lines pulls the water from between the lines to the open hydrophobic areas. Consequently, the photoresist lines 16 collapse toward each other, as shown in FIG. 1B. This compromises the structural integrity of the circuit pattern which is subsequently formed on the substrate 12. The water inbetween the two adjacent lines and on the BARC surface also becomes a watermark defect after developing (FIG. 2B).

Therefore, a method of inhibiting photoresist pattern collapse and defects during post-development photoresist processing steps is needed.

SUMMARY OF INVENTION

The present invention is generally directed to a method of inhibiting photoresist pattern collapse. In some illustrative embodiments, the method includes providing a substrate; providing a photoresist layer on the substrate; exposing and developing the photoresist layer; applying a top anti-reflective coating layer to the photoresist layer; rinsing the photoresist layer; and drying the photoresist layer.

BRIEF DESCRIPTION OF THE DRAWINGS

The invention will now be described, by way of example, with reference to the accompanying drawings, in which.

DETAILED DESCRIPTION

Figure 1A:
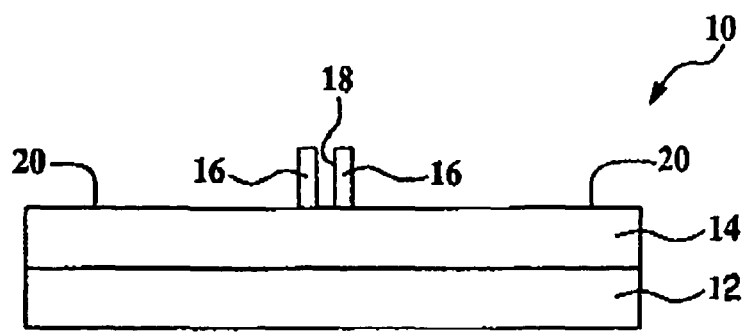
FIG. 1A is a cross-sectional view of a pair of adjacent developed photoresist lines after post-development rinsing and prior to a spin-drying step.
Figure 1B:
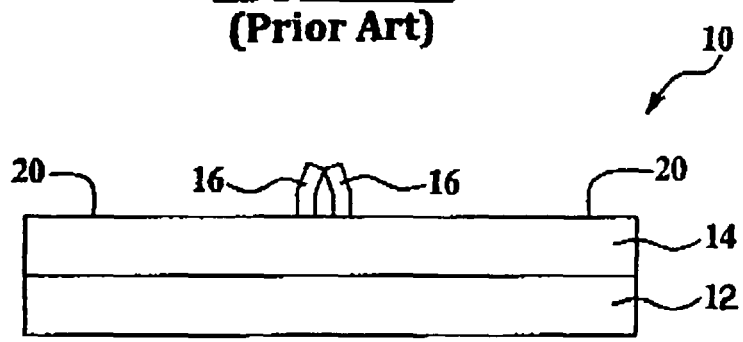
FIG. 1B is a cross-sectional view of the developed photoresist lines in a collapsed configuration after a post-development spin-drying step.

The present invention is generally directed to a method of inhibiting photoresist pattern collapse and defects during photolithography in the fabrication of semiconductors. Referring to FIGS. 2A-2F, cross-sectional views of photoresist structures 30 which are progressive intermediates in a photolithography process are shown. The photoresist structure 30 includes a substrate 32, which may be a silicon semiconductor wafer, for example. A BARC (bottom anti-reflective coating) layer 34 is typically provided on the upper surface of the substrate 32. In the photolithography steps which precede the step shown in FIG. 2A, a photoresist layer (not shown) is initially deposited on the BARC layer 34. The photoresist layer is then subjected to a baking process to evaporate solvent from the photoresist and densify the resist. Next, the photoresist layer is subjected to an exposure process in which light is transmitted through a patterned mask or reticle (not shown) onto the photoresist layer. The exposed photoresist layer is subjected to cleavage by baking, followed by photoresist development.

At the development step, the photoresist layer is exposed to a liquid developer solution such as TMAH (tetramethylammonium hydroxide), for example, 2.38% TMAH solution. The developer solution detaches the unexposed polymer portions from the exposed and cross-linked polymer portions of the photoresist and from the substrate 32, leaving the cross-linked portions of the photoresist on the substrate 32. Next, the substrate 32, with the developed photoresist thereon, is subjected to a rinsing step in which a rinsing liquid such as DI (deionized) water, for example, is sprayed on the photoresist layer typically as the substrate 32 is rotated. The rinsing step dissolves and removes the unexposed polymer portions of the photoresist layer from the underlying substrate 32. After the photoresist development and DI water rinsing steps, the surface of the BARC layer 34 includes both open hydrophobic areas 44 (FIGS. 2A-2E) and areas on which developed and cross-linked photoresist remains in the form of photoresist lines 42 (FIG. 2F). The photoresist lines 42 will ultimately define the boundaries of the circuit pattern which is to be subsequently formed on the substrate 32 after photolithography.

Figure 2A:
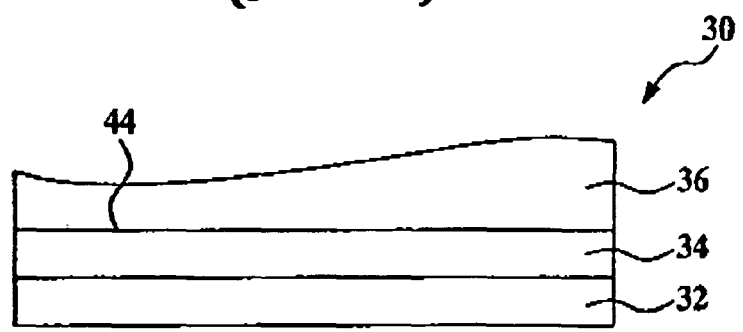
FIGS. 2A-2F are cross-sectional views of a substrate and a BARC layer formed on the substrate, illustrating process steps carried out according to a method of inhibiting photoresist pattern collapse.
Figure 2B:
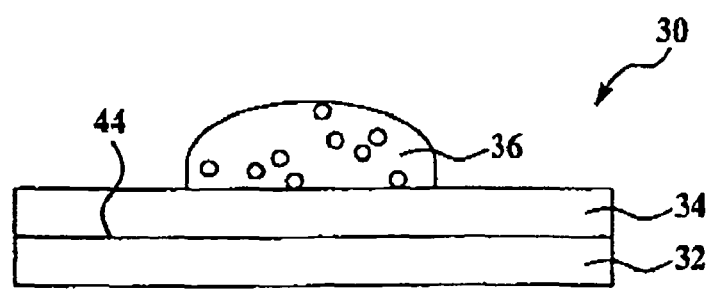

As shown in FIG. 2A, after the rinsing step, a liquid residue 36, which includes photoresist developing solution in addition to DI water and some dissolved photoresist, remains on the BARC layer 34. The liquid residue 36 typically covers the entire surface of the BARC layer 34, including the open hydrophobic area 44 and the photoresist lines 42 (FIG. 2F). In FIG. 2A, the liquid residue 36 is shown covering the open hydrophobic area 44. After the rinsing step, the substrate 32 is subjected to a drying step, such as a spin drying step in which the substrate 32 is rotated at a selected speed. As shown in FIG. 2B, the drying step gradually eliminates most of the liquid residue 36 from the substrate 32.

Figure 2C:
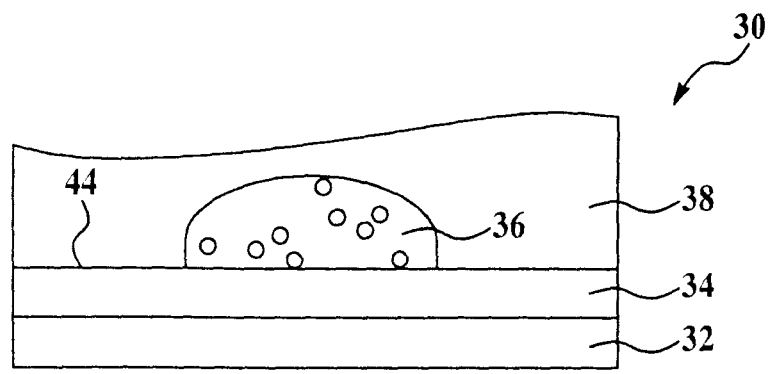
Figure 2D:
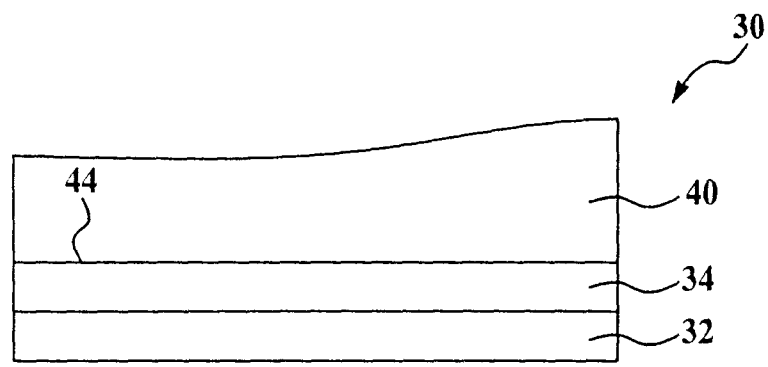

After the drying step is carried out to remove most of the liquid residue 36 from the substrate 32, a water-soluble polymer layer or a solution 38 is deposited over the BARC layer 34 and any liquid residue 36 remaining on the BARC layer 34, as shown in FIG. 2C. Some liquid residue 36 may remain both on the open hydrophobic areas 44 of the BARC layer 34, as well as in the space 43 between the photoresist lines 42 (FIG. 2F) of the developed photoresist. The water-soluble polymer layer or a solution 38 may be a TARC (top anti-reflective coating) layer or a surfactant solution, for example. Upon application of the water-soluble polymer layer 38 to the BARC layer 34, as shown in FIG. 2C, the liquid residue 36 mixes with the water-soluble polymer layer or solution 38 to form a generally homogenous liquid/polymer mixture 40 which covers both the PR lines 42 and the open hydrophobic areas 44 on the surface of the BARC layer 34, as shown in FIG. 2D. The surfactant solution includes an ionic or a non-ionic surfactant. In one example, the solution consists of 0.2% PFOS ionic surfactant.

Figure 2E:
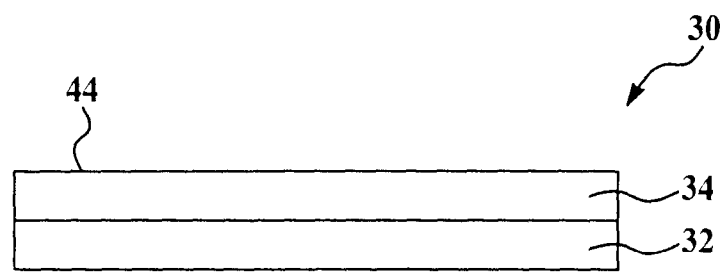
Figure 2F:
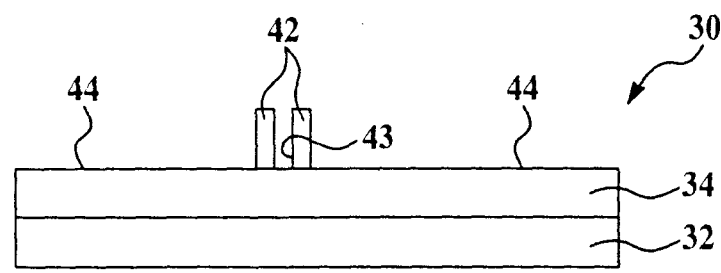

After application of the water-soluble polymer layer 38 to the substrate 32 as shown in FIG. 2C, the substrate 32 is subjected to a rinsing step using a rinsing liquid such as DI water. Alternatively, application of the water-soluble polymer layer 38 to the substrate 32 and rinsing of the substrate 32 may be carried out simultaneously. After that, the substrate 32 is subjected to a drying step such as a spin drying step. In the drying step, the liquid mixture 40 is removed from the BARC layer 34, as shown in FIG. 2E. Therefore, residual water from the rinsing step remains neither in the space 43 (FIG. 2F) between the photoresist lines 42 nor in the open hydrophobic areas 44 of the BARC layer 34.

Another embodiment of this invention includes the use of a special BARC layer 34. The BARC layer contains a low surface contact angle at a resist exposed area as shown in FIG. 2E. The surface contact angle of the exposed area of BARC 44 shown in FIG. 2E, may be lower than 60 degrees, preferably between about 50 and 60 degrees. With the improvement in the low contact angle BARC, the water drop residue observed in FIG. 2B may not be caused by the developing process. The BARC may contain a hydroxyl group, which may become more hydrophilic after contact with a developer. The BARC may also contain a lactone group, which may cause ring opening and hydrophilic after contact with the developer. The BARC may also contact an acid cleavable leaving group, which may leave its leaving group after contact with the acid and becomes more hydrophilic after developing. The BARC surface contact angle may be reduced in the exposed area after the developing process.

A final step in the photolithography process may include subjecting the substrate 32 to post-development baking. Because the water-soluble polymer layer 38 removes all residual DI water from the BARC layer 34, residual water is not drawn from the space 43 between the photoresist lines 42 to the open hydrophobic areas 44 on the BARC layer 34. This prevents collapse of the photoresist lines 42 toward each other, thereby preserving the structural integrity of a circuit pattern which is subsequently formed in the space 43 between the photoresist lines 42 after photolithography.

Figure 3:
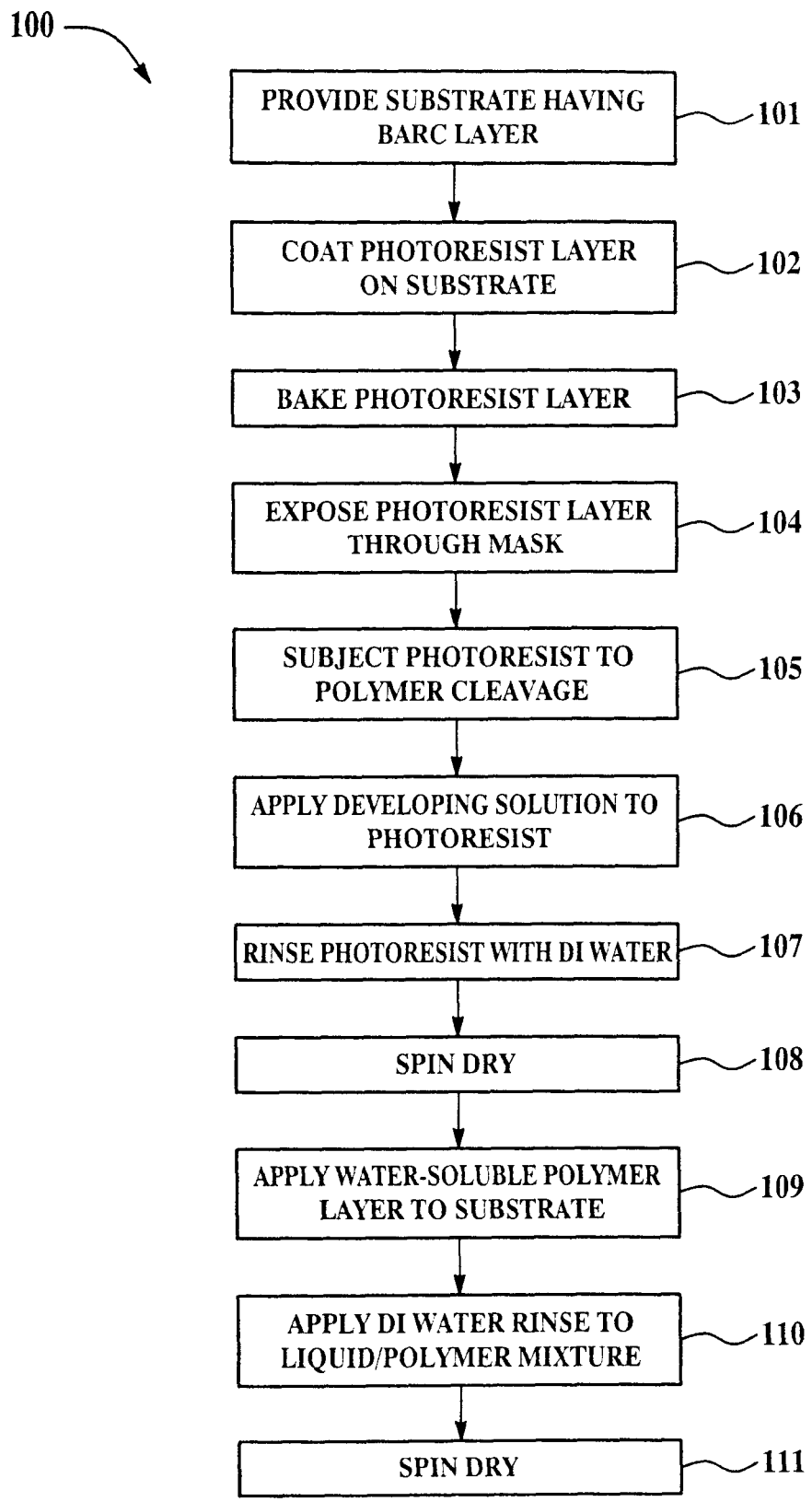
FIG. 3 is a flow diagram illustrating process steps carried out according to a method of inhibiting photoresist pattern collapse.

Referring next to FIG. 3, a flow diagram 100 illustrating process steps carried out according to a method of inhibiting photoresist pattern collapse is shown. In step 101, a substrate is provided. A BARC (bottom anti-reflective coating) layer may be provided on the surface of the substrate. In step 102, a photoresist layer is coated on the substrate. In step 103, the photoresist layer is typically subjected to a baking step to evaporate solvent from the photoresist and densify the resist. In step 104, the photoresist layer is exposed to light through a patterned mask or reticle to chemically cross-link the exposed regions of the photoresist layer in the form of a circuit pattern. In step 105, the exposed photoresist layer is subjected to polymer cleavage by subjecting the photoresist layer to a baking step. In step 106, a developing solution is applied to the photoresist layer. The developing solution removes unexposed photoresist from exposed, cross-linked photoresist and from the substrate.

In step 107, the photoresist layer, which includes both the developed, exposed and cross-linked portions and the undeveloped and unexposed portions of the photoresist, is rinsed with DI water. The DI water rinsing step removes the undeveloped photoresist from the substrate. In step 108, the substrate is subjected to a spin drying step to remove most of the liquid residue, which includes photoresist developer solution, undeveloped photoresist and DI water, from the substrate. However, some liquid residue remains on the surface of the substrate. Therefore, in step 109, a water-soluble polymer layer is deposited on the substrate. The water-soluble polymer layer may be a TARC (top anti-reflective coating) layer, for example. The water-soluble polymer layer combines with the liquid residue on the surface of the substrate to form a generally homogenous liquid/polymer mixture.

In step 110, the liquid/polymer mixture on the substrate is subjected to rinsing with DI water. This removes the liquid/polymer mixture from the surface of the substrate. In step 111, the substrate is subjected to a spin drying step to remove residual moisture from the substrate. Consequently, residual moisture is incapable of being drawn from spaces between photoresist lines to open hydrophobic areas on the substrate. Therefore, collapse of the photoresist lines toward each other is prevented, thereby preserving the structural integrity of a circuit pattern which is subsequently formed in the space between the photoresist lines after photolithography.

It will be appreciated by those skilled in the art that variations of the method of inhibiting photoresist pattern collapse outlined in steps 101-111 of FIG. 3 are possible. For example, steps 109 and 110 of the method can be combined into a single step in such a manner that the water-soluble polymer layer and the DI water rinse are added to the substrate at the same time. Alternatively, application of the water-soluble polymer may be preceded and followed by rinsing, followed by drying. Still further in the alternative, the substrate may be rinsed after development, followed by drying, application of the water-soluble polymer layer, rinsing and drying, respectively.

While the preferred embodiments of the invention have been described above, it will be recognized and understood that various modifications can be made in the invention and the appended claims are intended to cover all such modifications which may fall within the spirit and scope of the invention.

What is claimed is:

1. A method of inhibiting photoresist pattern collapse including collapse of photoresist lines toward each other, comprising:
    providing a substrate;
    providing an unpatterned photoresist layer on said substrate;
    light exposing and developing said unpatterned photoresist layer to pattern said unpatterned photoresist layer;
    applying a top anti-reflective coating layer or surfactant solution to said patterned photoresist layer following said developing;
    rinsing said patterned photoresist layer following or simultaneously with said applying to remove the top anti-reflective coating layer or surfactant solution from said patterned photoresist layer; and
    drying said patterned photoresist layer following said rinsing.

2. The method of claim 1 wherein said drying said patterned photoresist layer comprises spin-drying said patterned photoresist layer.

3. The method of claim 1 wherein said substrate comprises a bottom anti-reflective coating layer.

4. The method of claim 1 further comprising rinsing said patterned photoresist layer before said applying said top anti-reflective coating layer to said patterned photoresist layer.

5. The method of claim 1 further comprising cleaving said unpatterned photoresist layer by baking said unpatterned photoresist layer between said exposing and said developing.

6. A method of inhibiting photoresist patterncollapse including collapse of photoresist lines toward each other, comprising:
    providing a substrate;
    providing a photoresist layer on said substrate;
    light exposing, post exposure baking and developing said photoresist layer to pattern said photoresist layer;
    rinsing said patterned photoresist layer;
    spin drying said patterned photoresist layer;
    applying a top anti-reflective coating layer or surfactant solution to said patterned photoresist layer following said step of spin drying;
    rinsing said patterned photoresist layer following or simultaneously with said applying to remove the top anti-reflective coating layer or surfactant solution from said patterned photoresist layer; and
    spin drying said patterned photoresist layer following said rinsing to remove the top anti-reflective coating layer or surfactant solution.

7. The method of claim 6 further comprising a bottom anti-reflective coating layer on said substrate.

8. A method of inhibiting photoresist pattern collapse including collapse of photoresist lines toward each other, comprising:
    providing a substrate;
    providing an unpatterned photoresist layer on said substrate;
    light exposing, baking and developing said unpatterned photoresist layer to pattern said unpatterned photoresist layer;
    rinsing said patterned photoresist layer with deionized water following said developing;
    spin drying said patterned photoresist layer following said rinsing;
    applying a top anti-reflective coating or surfactant solution to said patterned photoresist layer following said spin drying; and,
    removing the top anti-reflective coating or surfactant solution from said patterned photoresist layer.

9. The method of claim 8 further comprising the step of spin drying the substrate following said applying.

10. The method of claim 8 further comprising the steps of rinsing with deionized water following or simultaneously with said applying and spin drying the substrate following said rinsing.

11. The method of claim 8, wherein said water soluble polymer layer comprises a top anti-reflective coating.

12. The method of claim 8, wherein said water soluble polymer solution comprises a surfactant.

13. The method of claim 12, wherein said surfactant comprises an ionic or a non-ionic surfactant.

14. The method of claim 8 further comprising a bottom anti-reflective coating layer on said substrate.

15. A method of inhibiting photoresist pattern collapsing and surface defect formation including collapse of photoresist lines toward each other, comprising the steps of:
    providing a substrate;
    applying a bottom anti-reflective layer on the substrate;
    applying an unpatterned photoresist layer on said bottom anti-reflective layer;
    light exposing, baking and developing said photoresist layer to pattern said photoresist layer;
    rinsing said patterned photoresist layer with deionized water following said developing;
    spin drying said patterned photoresist layer following said rinsing;
    wherein the hydrophilic character of the bottom anti-reflective layer increases and has a contact angle less than 60 degrees on exposed areas of said photoresist layer following contact with a developer solution in said developing; and
    wherein a top anti-reflective coating or surfactant solution is applied and removed from said patterned photoresist layer prior to the step of spin drying.

16. The method of claim 15, wherein said bottom anti-reflective layer contains functional groups which change its polarity after developing.

17. The method of claim 16, wherein said functional groups include a ring opening structure, said ring opening structure opening ring structures in said bottom anti-reflective layer upon contact with said developer solution.

18. The method of claim 17, wherein said ring opening structure includes lactone.

19. The method of claim 16, wherein said functional group includes hydroxyl.

20. The method of claim 16, wherein said functional group includes an acid sensitive leaving group.

* * * * *